United States Patent
Gudmundsson et al.

(10) Patent No.: US 6,487,696 B1
(45) Date of Patent: Nov. 26, 2002

(54) COMPENSATOR DESIGN OPTIMIZATION THROUGH EFFICIENT UTILIZATION OF SUBCOMPENSATORS

(75) Inventors: Thorkell Gudmundsson, San Jose, CA (US); Mark Erickson, San Bruno, CA (US); Cecilia Galarza, San Francisco, CA (US); Dan Hernandez, San Jose, CA (US); Tom Pare, Mountain View, CA (US)

(73) Assignee: Voyan Technology, Santa Clara, CA (US)

( * ) Notice: Subject to any disclaimer, the term of this patent is extended or adjusted under 35 U.S.C. 154(b) by 58 days.

(21) Appl. No.: 09/798,644

(22) Filed: Mar. 2, 2001

Related U.S. Application Data
(60) Provisional application No. 60/186,642, filed on Mar. 3, 2000.

(51) Int. Cl.[7] ............................................. G06F 17/50
(52) U.S. Cl. ...................... 716/2; 716/2; 716/4; 716/5
(58) Field of Search ..................... 716/2, 7, 4, 6, 716/5, 8; 703/5, 2, 3

(56) References Cited

U.S. PATENT DOCUMENTS

| | | | |
|---|---|---|---|
| 5,517,594 A | | 5/1996 | Shah et al. |
| 6,223,139 B1 | * | 4/2001 | Wong et al. ............... 356/401 |
| 6,246,972 B1 | * | 6/2001 | Klimasauskas .............. 700/30 |
| 6,289,298 B1 | * | 9/2001 | Belk ............................ 703/5 |
| 6,292,925 B1 | * | 9/2001 | Dellinger et al. .......... 709/315 |
| 6,415,421 B2 | * | 7/2002 | Anderson et al. ............. 716/4 |
| 6,425,113 B1 | * | 7/2002 | Anderson et al. ............. 716/5 |

OTHER PUBLICATIONS

Narendra Kumpati S. et al., entitled: "Adaptation and Learning Using Multiple Models, Switching, and Tuning", Control Systems, Jun. 1995, vol. 15, No. 3, pp. 37–51.

Rangan, Sundeep et al., entitled: "Robust Adaptive Stabilization with Multiple Uncertainty Models and Switching", Proceedings of the American Control Conference, Philadelphia, PA, Jun. 1998, pp. 3644–3648.

Morse, Stephen, entitled: "Supervisory Control of Families of Linear Set–Point Controllers—Part 1: Exact Matching", IEEE Transactions on Automatic Control, vol. 41, No. 10, Oct. 1996, pp. 1413–1431.

* cited by examiner

Primary Examiner—Vuthe Siek
Assistant Examiner—Binh C. Tat
(74) Attorney, Agent, or Firm—Blakely, Sokoloff, Taylor & Zafman LLP

(57) ABSTRACT

A method and system for designing a compensator for a system is described. A structure of a model set and a compensator set is defined. The defined model set and compensator set is processed. Model set, compensator set, and model subsets are created from the processed model and compensator set. The created model set, compensator set, model subsets are evaluated.

10 Claims, 10 Drawing Sheets

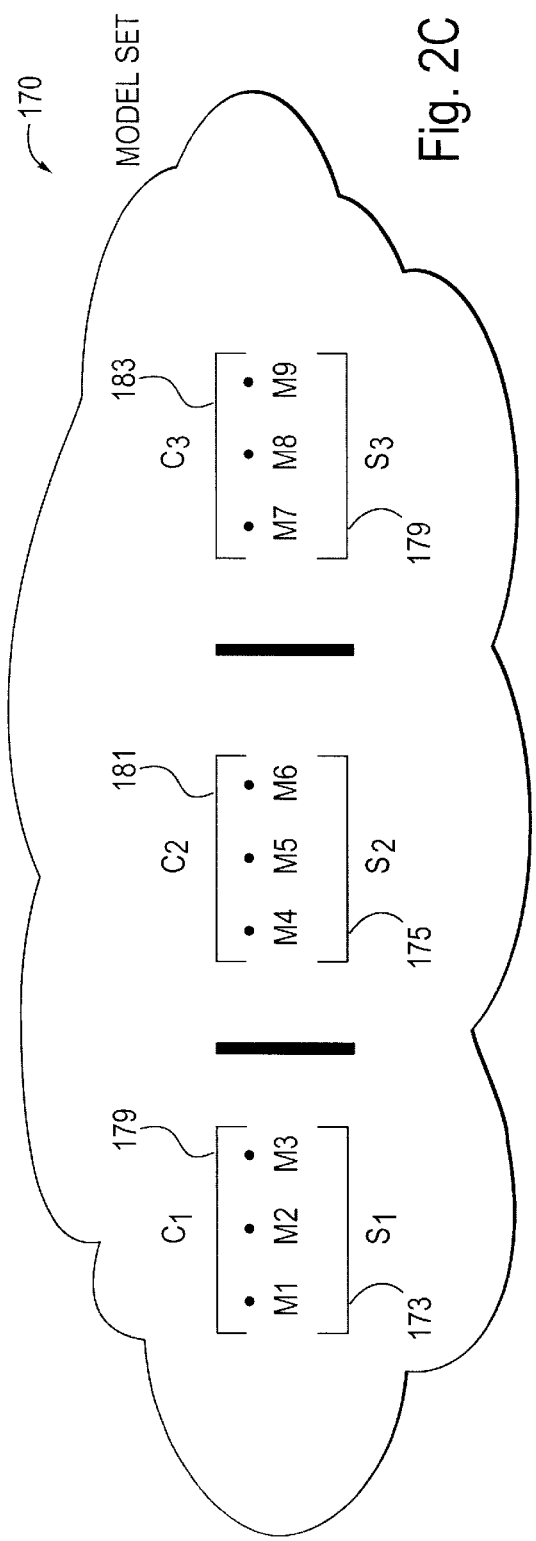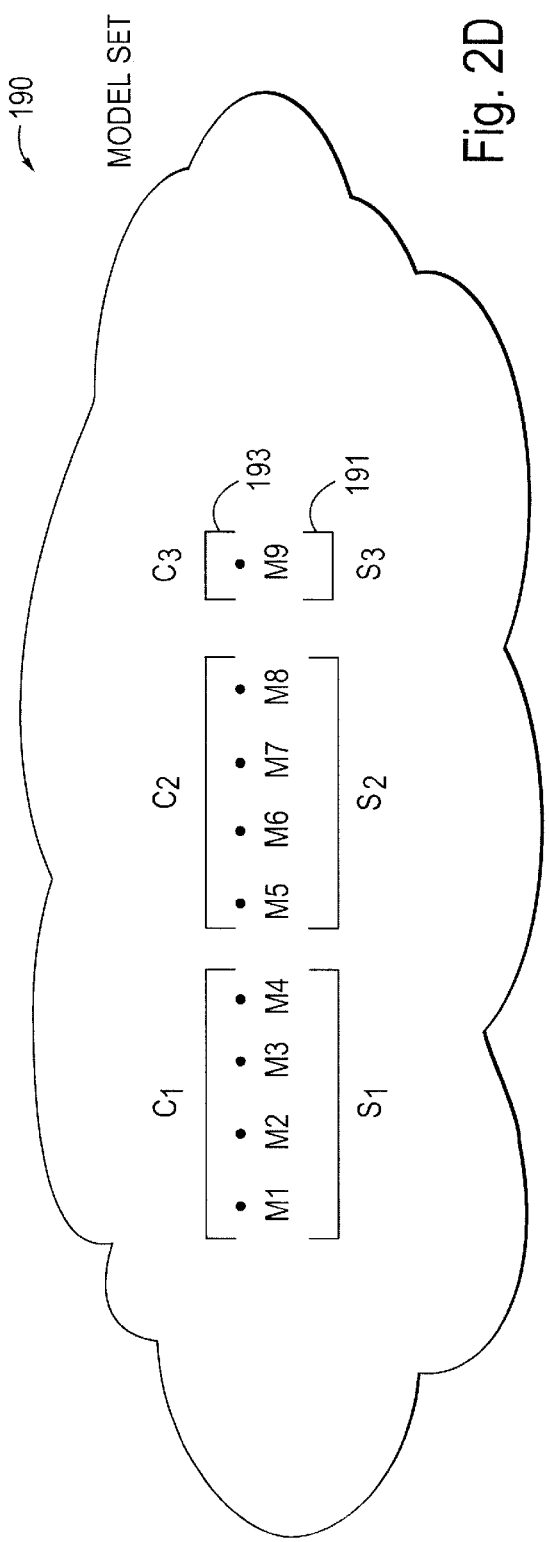

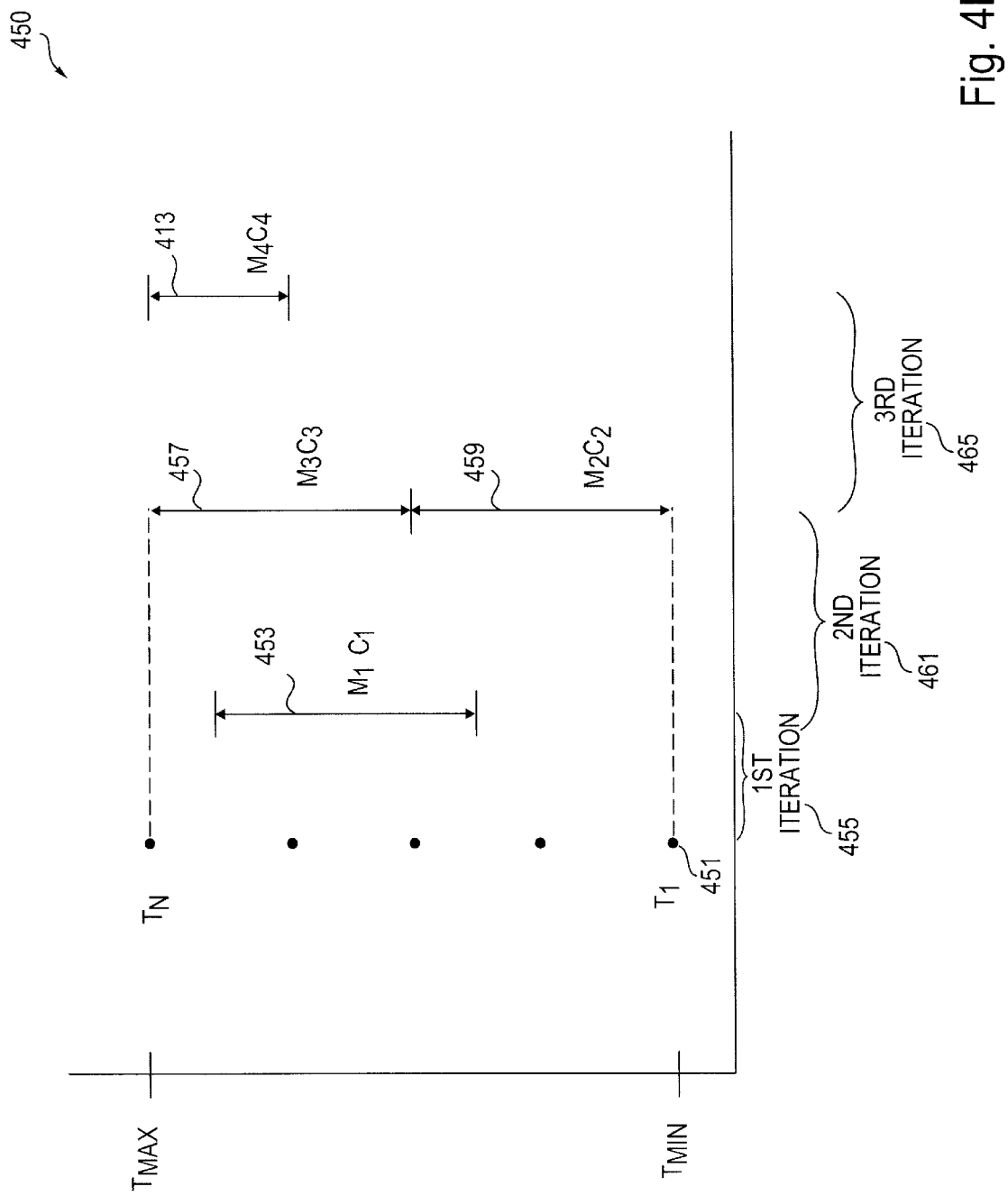

COMPENSATOR DESIGN OPTIMIZATION THROUGH EFFICIENT UTILIZATION OF SUBCOMPENSATORS

This application claims the benefit of the filing date of the Provisional U.S. patent application titled "Optimal Control Design for Multiple-Model Controllers", provisional application Ser. No. 60/186,642, filed Mar. 3, 2000.

FIELD OF THE INVENTION

The present invention relates generally to compensator design methodology and, more particularly, to a method for minimization of compensator design efforts by efficient utilization of sub-compensators.

BACKGROUND OF THE INVENTION

The design and manufacture of new products has become an increasingly complex activity due to reliance on features requiring high performance compensators. It should be noted that throughout this specification the term compensator is used to describe various types of compensators for example in the communications arena a compensator may be an equalizer or in the control arena a compensator may be a feedback controller. Thus, to avoid confusion the term compensator is used throughout this specification.

In order to design compensators for a dynamic system, a designer must go through a number of operations in a design cycle. First, a desired performance of the dynamic system is identified and qualified. Then, the designer must create a model characterizing the system. In the process of constructing the model, the designer may rely on prior knowledge encompassing available scientific formulas and on experimental data gathered from previous experiments conducted on the system. The model obtained is a mathematical representation of the system's behavior.

Next, using the model previously created, a compensator is designed for the system (design cycle). The compensator, that was designed, is tested to determine the performance of the compensated system. Depending upon the outcome of the tests, several portions of the design cycle may be repeated, until the design results in a final product (i.e., a compensator design) to be used with the system.

In the design cycle, standard design tools and methodologies are often used to design the compensator. These standard design tools and methodologies work well in situations where the compensator is being designed for a system that exhibits linear behavior. However, many systems and manufacturing processes exhibit nonlinear behavior or are made up of many similar but not identical systems. Thus, such systems have become too complex for standard tools and methodologies, and the compensator design performed by such methodologies is often inadequate.

Existing compensator design tools and methodologies are created for those skilled in the art of compensator design and require a high level of expertise. One shortcoming of such compensator design tools and methodologies is the selection of design parameters used in the design process. The design parameters must be selected manually by a knowledgeable designer, which often proves to be a difficult task. A typical example of such a tool is MATLAB® Control System Toolbox, available from Mathworks, Inc. of Natick, Mass.

Other known compensator design tools and methods attempt to solve the compensator design problem numerically by applying automatic optimization techniques to the entire set of design parameters in order to find optimal parameter values. For a large number of parameters, the optimization procedure is computationally intractable. One example of such software tool is QDES, described in detail in *Linear Controller Design: Limits of Performance*, by Boyd and Barratt, Prentice Hall 1991.

Other compensator design methodologies apply a weighted sum approach in order to size the model set and compensator set appropriately to arrive at a desired performance level. The weighted sum approach works well if all the variables are in the same units, but in most compensation problems the variables being taken into consideration are often unrelated and thus have a variety of units.

Thus, what is needed is a method and system for designing a compensator for a system where the system has particularly difficult behavior or where standard methods for compensator design are not good enough to compensate the particular behaviors of the system.

SUMMARY OF THE INVENTION

A method and system for designing a compensator is described. A structure of a model set and a compensator set is defined. The defined model set and compensator set is processed. Model set, compensator set, and model subsets are created from the processed model and compensator set. The created model set, compensator set, and model subsets are evaluated. The compensator design method provides adequate support for each model in the model set and results in attaining a high performance compensator that is adaptable in various environments.

BRIEF DESCRIPTION OF THE DRAWINGS

The objects, features, and advantages of the present invention will be apparent to one skilled in the art from the following detailed description in which:

FIG. 2C shows an exemplary model set, compensator set and model subsets according to one embodiment;

FIG. 2D shows an exemplary model set, compensator set and model subsets according to one embodiment;

FIG. 4B illustrates one embodiment of a model set and compensator set for a batch thermal reactor system;

DETAILED DESCRIPTION

Figure 1:
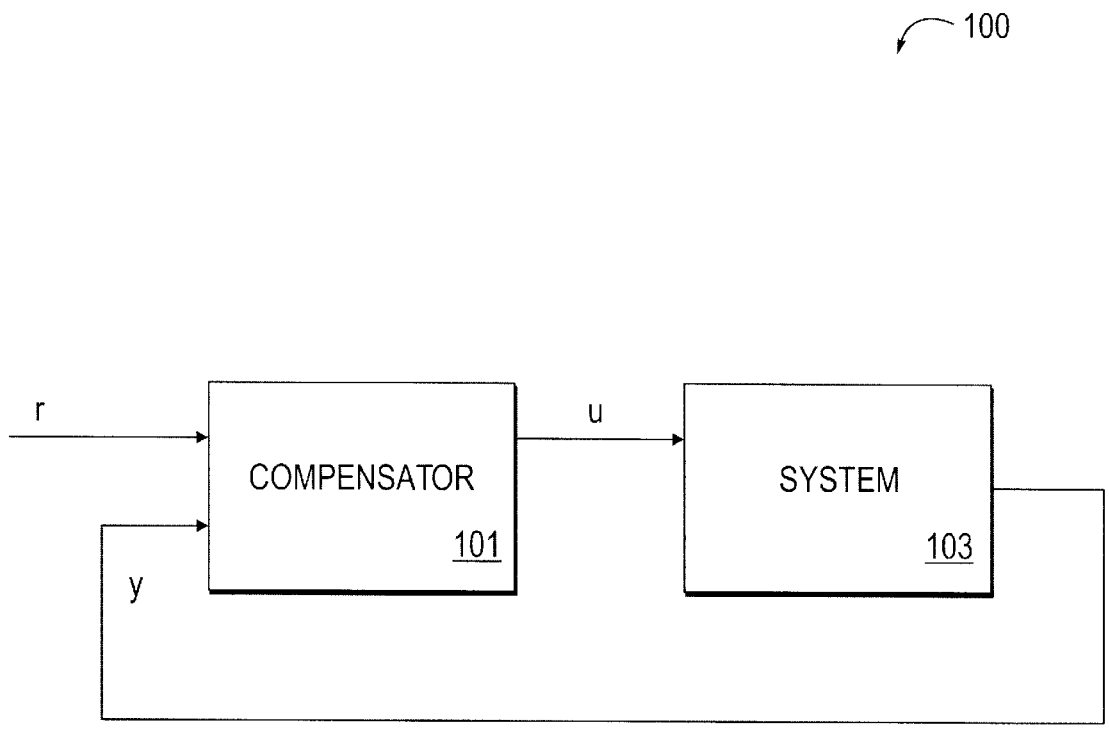
FIG. 1 is a block diagram of an example of a control system architecture according to one embodiment.

In the following description, for purposes of explanation, numerous specific details are set forth in order to provide a thorough understanding of the present invention. It will be evident, however, to one skilled in the art that the present invention may be practiced without these specific details. In some instances, well-known structures and devices are shown in block diagram form, rather than in detail, in order to avoid obscuring the present invention. These embodiments are described in sufficient detail to enable those skilled in the art to practice the invention, and it is to be understood that other embodiments may be utilized and that logical, mechanical, electrical and other changes may be made without departing from the scope of the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention can be implemented by an apparatus for performing the operations herein. This apparatus may be specially constructed for the required purposes, or it may comprise a general purpose computer, selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method. For example, any of the methods according to the present invention can be implemented in hard-wired circuitry, by programming a general purpose processor or by any combination of hardware and software. One of skill in the art will immediately appreciate that the invention can be practiced with computer system configurations other than those described below, including hand-held devices, multiprocessor systems, microprocessor-based or programmable consumer electronics, network PCs, minicomputers, mainframe computers, and the like. The invention can also be practiced in distributed computing environments where tasks are performed by remote processing devices that are linked through a communications network. The required structure for a variety of these systems will appear from the description below.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein.

Furthermore, it is common in the art to speak of software, in one form or another (e.g., program, procedure, application . . . ), as taking an action or causing a result. Such expressions are merely a shorthand way of saying that execution of the software by a computer causes the processor of the computer to perform an action or produce a result.

The present invention is a method and system for designing a compensator for a system that exhibits a particularly difficult behavior(s). Such systems may be modeled (or described) with differential (i.e., continuous time) equations or difference (i.e., discrete time) equations. The present invention may be used to design a compensator or a set of compensators where system behavior is linear, nonlinear, and/or where the system is made up of a collection of many similar but not identical systems.

The present invention may be used to develop a collection of models that describe the behavior of the system under the operating conditions that the user cares about. The models should have certain properties, for example, at every operating condition at least one of the models should be a good indicator (or representation) of how the system would behave. Also, each model should have a structure that is easy to work with, for example, smaller size is better (i.e., fewer number of equations) and linear is highly desired. It should be noted that even a nonlinear system may be broken up into a set of linear models. Additionally, when developing a model set, fewer models are more desirous. When developing the model set the user should balance the above properties with the overall purpose for developing a collection of models, i.e., to convert the complex real system into a set of less complex models.

The present invention may also be used to develop a collection of compensators that either cause the model to perform the way the user wants or will manipulate the information from the model in a way that the user wants. Similar to the development of the models above, the compensators should have certain properties, for example, for each model in the model set at least one compensator should cause the model to perform the way the user desires. Ultimately for each operating condition of the real system that the user cares about there is at least one compensator that causes the system to operate in a way the user desires. Also, like with the model set, fewer compensators and simpler compensators are more desirable.

For ease of understanding the following terminology is defined and used to help aid in the understanding of the concepts of the present invention. S is defined as the model set and s is an element in the model set S, such that s ∈ S. C is defined as the compensator set and c is an element in the compensator set C, such that c E ∈ C. $S_i$ is defined as a subset of the model set S, such that $S_i \subset S$. Additionally the following parameters are defined: size(S) is defined as the number of elements s in the model set S. size(C) is defined as the number of elements c in the compensator set C, and perf(C,S) is defined as the performance of how well the elements of the compensator set C cause the elements of the model set S do what the user desires.

The size(S), size(C), and perf(C,S) are all competing considerations in the design. These competing considerations are either constrained or optimized as part of the present invention. The determination whether to constrain or optimize a particular consideration is often determined by outside factors for example, a particular manufacturer may be concerned about compute resources thus requiring fewer models, another manufacturer may be concerned about the available room on a chip thus requiring fewer compensation sets, yet another manufacturer may be concerned about how quickly something can be turned out without regard for the performance thus requiring less performance.

The present invention takes into account the competing considerations in a matrix form. For example the matrix may be mapped as follows:

|  | Contrain | Optimize |
| --- | --- | --- |
| size(S) | size(S) ≤ $n_s$ | minimize(size(S)) |
| size(C) | size(C) ≤ $n_c$ | minimize(size(C)) |
| perf(C,S) | perf(C,S) ≥ P | maximize(perf(C,S)) |

When constraining a consideration that constraint is either met or not. When optimizing a consideration it is either minimized or maximized as much as possible. Keeping the matrix and the considerations discussed above should aid the reader in considering the following examples and embodiments of the present invention.

GENERAL EXAMPLE

FIG. 1 shows an example of a closed loop system architecture 100. In one embodiment, the present invention is described in connection with a closed loop system. Although the following description describes the present invention in conjunction with closed loop systems, the present invention may also be implemented with open loop systems.

Referring to FIG. 1, a system 103 is driven by an input signal u, generated by a compensator 101. In one embodiment, the compensator 101 may use the output y of the system 103 and a reference signal r to generate the input signal u. Alternatively, the compensator 101 may operate without either of these signals. In one embodiment, the system 103 is a physical process, the signal u is a computer representation of the physical actuation of the system 103, and the signal y is a computer representation of physical measurements taken from the system 103. Further, the reference signal r is specified by a user, and the compensator 101 is implemented as a computational algorithm on a computer system.

According to one embodiment, the system 103 is modeled by a linear multi-input, multi-output (MIMO) system described by:

$$x_{k+1} = Ax_k + Bu_k$$

$$y_k = Cx_k$$

where $x_k$ is a state vector, also known as memory of the system 103, $u_k$ is a vector of input signals, $y_k$ is a vector of output signals, k is a time index with k=0,1,2, ..., and A, B, and C are matrices of appropriate dimensions. The compensator includes a linear estimator and a constant state-feedback regulator with integral action and is described by the following formulas:

$$x'_{k+1} = Ax'_k + Bu_k + L(y_k - y'_k)$$

$$y'_k = Cx'_k$$

$$u_k = K_1 x'_k + K_2 \sum_{j=o}^{k} (r_i - y'_i)$$

where L, K, and $K_2$ are adjustable gain matrices and represent correction factors, and $x'_k$ and $y'_k$ represent estimations of the state vector and the vector of output signals. In an alternate embodiment, the compensator is composed of several such components, with different state vectors and parameters matrices, each for a different range of y. Such compensator components are called local compensators. In one embodiment, the adjustable regulator gain matrices $K_1$ and $K_2$ may be computed using linear-quadratic optimization methods from a first set of design parameters $$P = \{R_r, Q_r | R_r > 0, Q_r \geq 0\}$$

where each element of the set of design parameters represents a full parameter matrix of suitable dimensions. In one embodiment, the first set of parameters P includes a large number of parameters. Similarly, the adjustable gain matrix L may also include a large number of parameters.

The compensator 101 is designed for a particular system, such as the system 103, so as to achieve a desired level of performance. A sequence of tasks needed to complete a design of the compensator for a system is called a design cycle. In one embodiment, the design cycle contains multiple feedback and feedforward paths. A decision to proceed on a particular path is taken based on the status of the design at a particular point in time. Alternatively, the design cycle may be performed without multiple feedback and feedforward paths.

In one embodiment, the designer or user of the design cycle solely selects the design strategy. Alternatively, in selecting a design strategy, the designer may use a real-time planner. An example of a real time planner is described in U.S. patent application Ser. No. 09/345,172, filed Jun. 30, 1999, entitled Real-Time Planner for Design, to Sunil C. Shah, Pradeep Pandey, Thorkell Gudmundsson, and Mark Erickson, and assigned to assignee herein, still pending. An example of a design cycle will be described in further detail below.

Figure 2A:
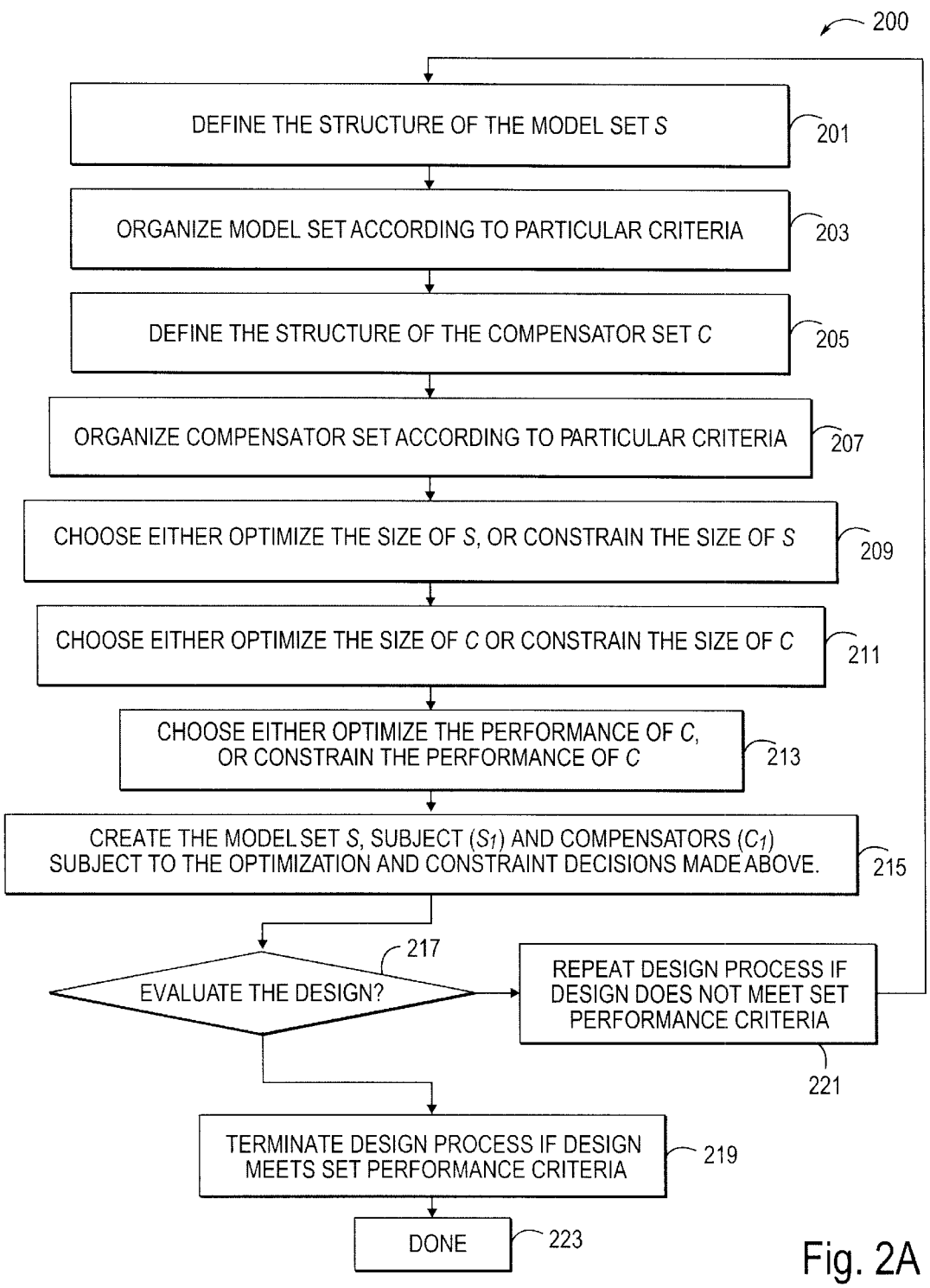
FIG. 2A illustrates a design cycle flow chart for designing a compensator for a system according to one embodiment.

FIG. 2A illustrates a general example of a design cycle flow chart of an operation 200 for designing a compensator for a system according to one embodiment. Operation 200 can be implemented in conjunction with closed loop system architecture 100. In another embodiment, Operation 200 may be performed in conjunction with an open loop system architecture. Operation 200 also allows an algorithm to define structures of a model set S and compensator set C and choose from several available criteria resulting in a high performance (perf(C,S)) compensator design for the system.

At operation block 201, the structure of a model set is defined. A model set S represents a plant or family of plants and consists of a collection of a finite number of dynamic models s of the plants. Each dynamic model s in the model set S represents the behavior of the plant or one member of the family of plants under a set of operating conditions. Collectively the entire model set S represents the behavior of the entire system under all operating conditions.

Figure 2B:
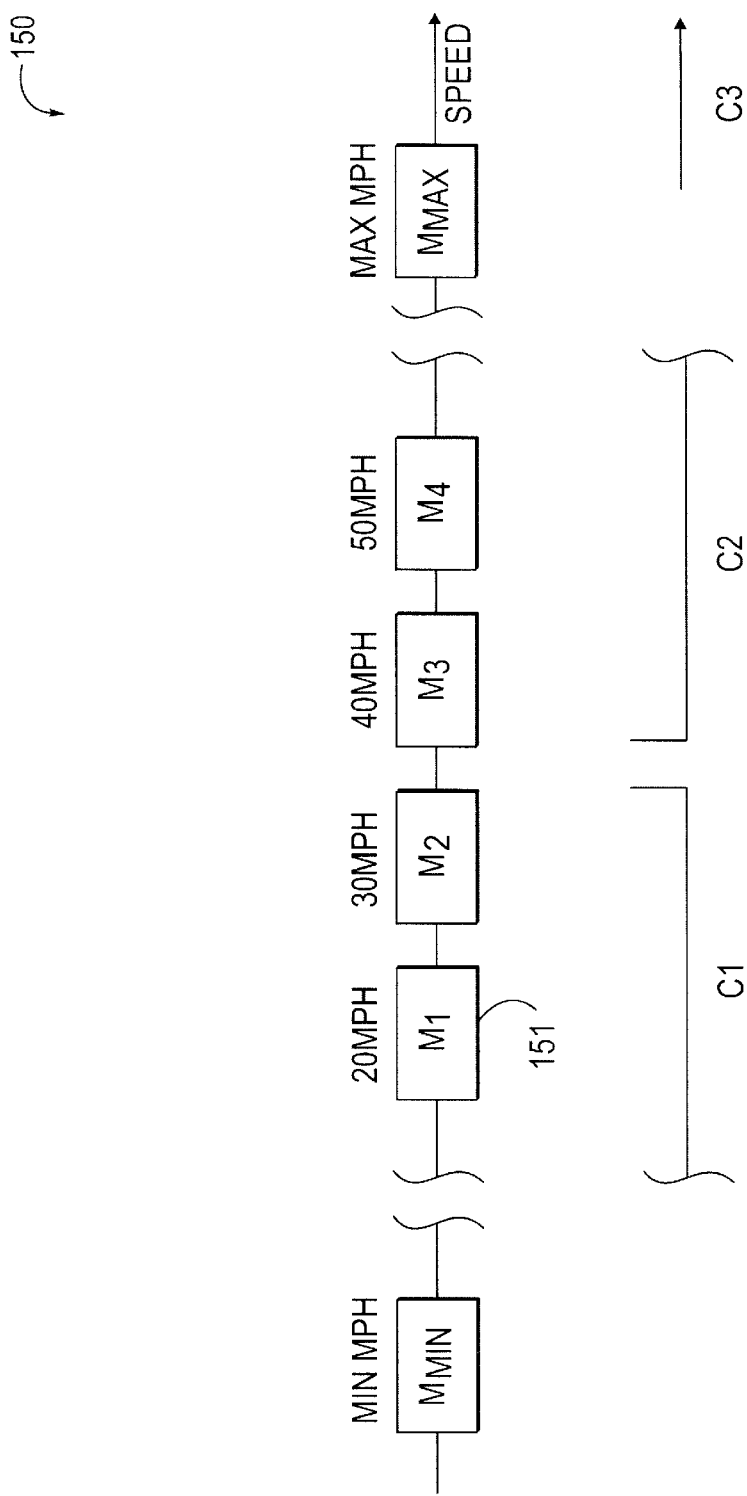
FIG. 2B is a block diagram of a model set representing the speed of a car according to one embodiment.

For example as shown in FIG. 2B, a model set 150 is defined for a system representing the speed of a car. Each dynamic model in the model set represents the behavior of a car under a particular speed. For example, model M1 151 represents the behavior of the car at a speed of 20 MPH.

The number of models in a model set may be predetermined. The number is based on several considerations such as operating cost to build a model, ease of testing built models, system memory capability of handling model processing, and level of accuracy needed for the particular system for which the model is being defined. Further embodiments of model sets for various systems are described in FIGS. 3A, 4A and 5.

At operation block 203, the defined model set is organized according to particular criteria. Organization consists of ordering the models in a sequential form and arranging the ordered models according to the particular criteria. For example, as shown in FIG. 2B, models are ordered and arranged according to speed. They are arranged in a sequence of increasing speeds such as 20 MPH, 30 MPH, 40 MPH and so on. Alternatively, the model set can be arranged in any order that may meet the particular users desired needs.

At operation block 205, the structure of a compensator set is defined. A compensator set C is a collection of a finite number of compensators. A compensator c in a compensator set C can be one or any combination of an open loop compensator, a closed loop compensator and/or a controller and its variations. For example, a compensator can be a feedback servo controller for a positioning system or an equalizer in a communications system.

A compensator set C is defined such that for each dynamic model s in the model set S, there exists a compensator c from the compensator set C that performs the task intended by the dynamic model s. It should be noted that the number of compensators c are not necessarily equal to the number of dynamic models s. There may be fewer compensators c than dynamic models s because some of the compensators c may cause more than one dynamic model s to perform as desired. It should also be noted that the reverse may be true. The size of the compensator set C and model set S will depend upon the particular system being modeled and compensated for and the particular operating conditions that are of importance to the user.

The number of compensators c in a compensator set C may be predetermined. The number is based on several considerations such as operating costs, system capability of handling compensator processing, complexity of task attempted by the dynamic model, and level of accuracy needed for the particular system for which the model is being defined. Further embodiments of compensator sets for various systems are described in FIGS. 3A, 4A and 5.

At operation 207, the compensator set is organized according to a particular criteria. Organization consists of ordering the compensators in a sequential form and arranging the ordered compensators according to the particular criteria. For example, as shown in FIG. 2B, a first compensator, C1, in the compensator set may be designed to represent all the models that fall in the range of speeds 10 MPH to 30 MPH. A second compensator, C2, in the compensator set may be designed to represent models that fall in the range of speeds 40 MPH to 60 MPH, and a third compensator, C3, in the compensator set may be designed to represent models in the range of speeds 70 MPH and above.

The compensators in the compensator set are arranged in a sequential order such as C1, C2, and C3 or C3, C2 and C1 representing models in terms of increasing or decreasing speed. Alternatively, compensators in the compensator set can be arranged in any desired order.

At operation block 209, a choice is made to either optimize or constrain the size/number of the model set S. Model set S optimization consists of minimizing the size of the model set S, min(size(S)). The optimal number of models is determined through an iterative process. The iterative process consists of defining an initial number of models and increasing the number of models if the initial number of models do not adequately define the behavior of the system to which they are being applied. In the alternative the number of models may be decreased if the initial number of models overlap in the definition of the behavior of the system.

Optimization is typically performed in a system in which it is very expensive to collect data for building the models. Alternatively, several other reasons exist for performing optimization. One of the reasons includes having a system that has a small or inadequate memory to support a large model set. Another reason includes having a system in which a very accurate representation of the system is not necessary to accomplish design goals.

Constraining the size of the model set consists of limiting the number of models s within the model set S to a maximum number $(n_s)$ and no more $(size(S) \leq n_s)$. Constraining is typically performed in a system where building and testing models is not very expensive. Constraining is also performed in situations where a high need for system accuracy exists, and system memory is capable of supporting all the models and simultaneously perform other system operations.

The choice to constrain or to optimize the size of the model set therefore depends upon the application, system performance requirements and system capability. For example, a disk drive tracking control system can have a large number of models. This is because the disk drive tracking control system is fast and allows easy collection of data. Models for a disk drive tracking control can be tested by allowing a computer to process the data that is collected. Additionally, a high level of accuracy in reading/writing disk drive data is important.

Whereas, in an application for a manufacturing system for creating an inexpensive micro-controller, the system may only have a small memory handling capability. In this case the number of models become very critical, where a minimal number of models is desired for system performance levels and system memory. Thus, in such a situation, the model set may be optimized.

At operation block 211, a choice is made to either optimize or constrain the size of the compensator set C. Compensator set optimization, similar to model set optimization, consists of minimizing the size of the compensator set C, min(size(C)). The reasons for optimizing the size of a compensator set are similar to the reasons described earlier in regard to operation block 209 for optimizing the size of the model set S. In addition, optimizing the size of the compensator set also improves the final multiple-compensator product by minimizing the number of transitions between compensators, thus, reducing the chance of exceeding allowable system memory and/or the chance of overloading the system.

Similar to constraining the size of model sets, constraining the size of the compensator set C consists of limiting the number of compensators c within the compensator set C to a maximimum number ($n_c$) and no more (size(C)≤$n_c$). The reasons for constraining the size of a compensator set are similar to the reasons described earlier in operation block 209 for constraining the size of the model set.

At operation block 213, a choice is made to either optimize or constrain the performance of the compensator set perf(C,S). Optimizing performance consists of choosing compensators in the compensator set and optimizing the worst-case performance of the compensators as applied to the model set (max(perf(C,S)). Since each compensator in the compensator set supports at least one or more models in the model set, optimizing performance of the compensator set therefore results in minimizing the worst-case performance for each individual compensator c in the compensator set C.

Constraining performance of a compensator set consists of specifying a set level for performance (P) and the system will meet or exceed that set performance level (perf(C,S) ≧P). The performance level requirements vary for each application. For example the performance level requirements for a high quality disk drive tracking control manufacturing system can be set to a worst-case performance requirement. This means that if there were a million disk drives produced, then the worst-case requirement would ensure that every disk drive that is produced by the disk drive tracking control manufacturing system will in the worst-case meet the requirements. This type of performance level requirement is typically specified in a system where high level of accuracy is desired.

Alternatively, the performance requirement may be lower than worst-case requirements. For example, the performance level requirements for manufacturing very small and inexpensive firecrackers may be set to an average performance level requirement. This means that a higher percentage of error is tolerated by the system. The requirement would result in an average performance being better than some amount, i.e. an average number of firecrackers would be better than a set average performance level requirement. This type of performance level requirement is typically specified in a system where a higher level of error is tolerated, or where it is not as important to ensure every individual piece performs at peak levels.

At operation block 215, the model set, compensators, and model subsets are created. The model set is created based upon the optimization and constraining decisions made earlier. For example a decision to optimize the size of the model set, constrain the size of the compensator set and optimize the performance of the model set may have been made earlier in the design cycle. Such decisions would result in minimizing the number of models, sizing the number of compensators c in the compensator set C to be less than or equal to a specified number of compensators, and maximizing the performance of the compensator set C with respect to the model set S. The size of the model set S would be derived from optimization performed in operation block 209, and the number of compensators c in the compensator set C would be derived from the constraint performed in operation block 211.

Alternatively, in another example, a decision could be made to constrain the size of the model set, constrain the size of the compensator set, and optimize the performance of the compensator set.

As a further alternative, any combination of constraining and optimizing the size of the model set, compensator set, and performance of compensator set could be made and would depend upon the type of application for which the compensator is being created.

It should be noted that the choices to either optimize or constrain the size of the model set S, size of the compensator set C, and performance of the compensator set (i.e., blocks 209, 211, 213) may be performed in any order or simultaneously.

Model sets are further subdivided into model subsets. Each model subset contains some division of the total models in the model set. Dividing model sets into subsets allows assignment of a compensator to each model subset. In general having a higher number of subsets allows the assigned compensator to provide better support to the models in the subset. However, as discussed earlier, the number of compensators that can be designed for a model set may be limited by the optimizing and constraining decisions made earlier.

As an example, FIG. 2C illustrates a model set 170 containing 9 models (M1 through M9) and 3 compensators. The number of models and compensators to design are determined from optimizing and constraining decisions made earlier. The model set is divided into 3 subsets S1, S2 and S3 where each subset contains 3 models. A compensator from the compensator set C1, C2, and C3 is assigned to each subset.

However, even if a decision were made earlier to limit the number of compensators in a system, properly splitting the model set into subsets and allocating a compensator for each subset would enhance the support provided by the compensator. For example, as shown in FIG. 2D assume earlier made decisions resulted in 9 models (M1 through M9), and 3 compensators. Also assume that model M9 was a very critical piece of the design, then the model set can be subdivided into 3 subsets S1, S2 and S3 where subset S1 would contain model M1 through M4, subset S2 would contain model M5 through M8, and subset S3 191 would contain model M9 only. This would further allow assigning compensator C1 to subset S1, compensator C2 to subset S2, and Compensator C3 193 to Subset S3 191 and solely to support model M9.

Alternatively, any type of model subset compensator combination can be achieved by splitting a model set into subsets with a desired number of models. Further embodiments of creating a model set, compensator set, and model subsets for various systems are described below in conjunction with FIGS. 3A, 4A and 5.

In one embodiment, a single compensator is assigned to each subset. In alternative embodiments, multiple compensators can be assigned to each subset or one compensator may support two or more subsets or other similar variations.

At operation block 217, the compensator design for the system is evaluated. The evaluation consists of testing models in the model set with the performance criteria set in operation block 213. Type of testing required to determine whether the performance criteria is met differs for each application. For example, testing for a model that is designed to analyze behavior of a thermal oven under various temperatures includes performing temperature measurements at various places in the thermal oven and comparing them with a performance temperature set earlier in the design process.

At operation block 219, the compensator design process is terminated based on satisfactory results. If the testing of models performed in operation block 217 results in a performance that meets the performance level set in operation block 213, then the compensator design process is completed.

At operation block 221, the compensator design process is repeated based on unsatisfactory results. If the testing of models performed in operation block 217 results in a performance criteria that does not meet the performance criteria set in operation block 213, then the compensator design process is repeated.

The repetition may not be the repetition of the entire design process but repetition of only those operational blocks that are necessary to produce satisfactory performance level. For example, repetition may be performed to tweak the existing design model by adding more compensators or changing earlier made decisions from optimizing the size of a compensator set or model set by constraining the size. Alternatively, either the entire design process or any combination of operation blocks may be repeated for achieving a satisfactory performance level.

The repeated and changed design is tested again at operation block 217. The iterative process is repeated until a satisfactory result of matching the set performance level is produced. Alternatively, the performance level set earlier can be changed to allow for a lower or higher performance. As a further alternative, some systems may also be configured to allow for a certain number of repetitions before terminating the process altogether.

At operation block 223, the compensator design is completed. The completed design would result in producing satisfactory results of matching the set performance level. It should be noted that the General Example of the present invention may be used to design compensators such as feedback controllers for disk drive systems and semiconductor manufacturing systems as well as equalizers for communications systems. Following are examples of how the General Example given above may be applied to a disk drive system and a thermal reactor system.

DISK DRIVE EXAMPLE

Figure 3A:
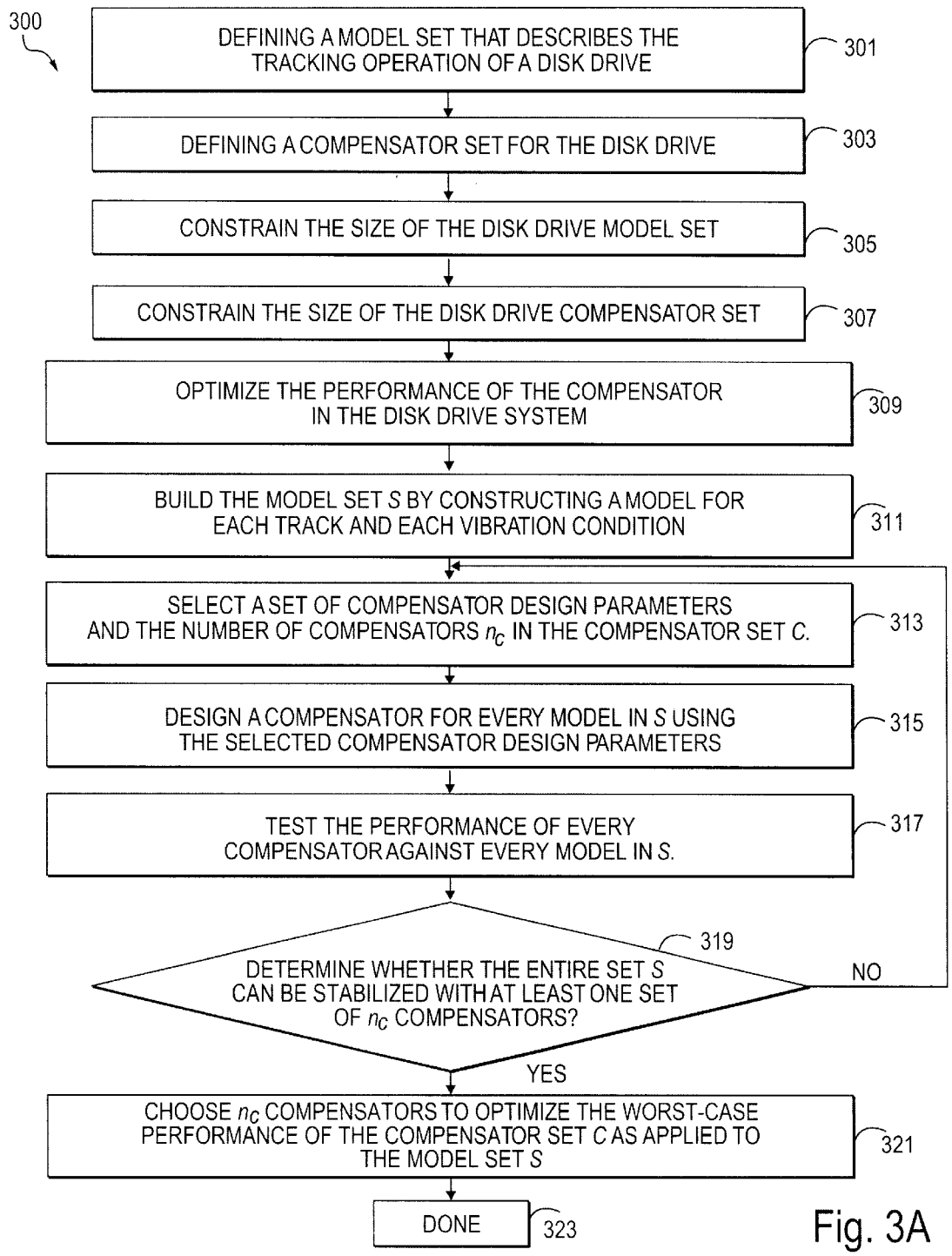
FIG. 3A illustrates a design cycle flow chart for designing a compensator for a disk drive tracking control system according to one embodiment.
Figure 3B:
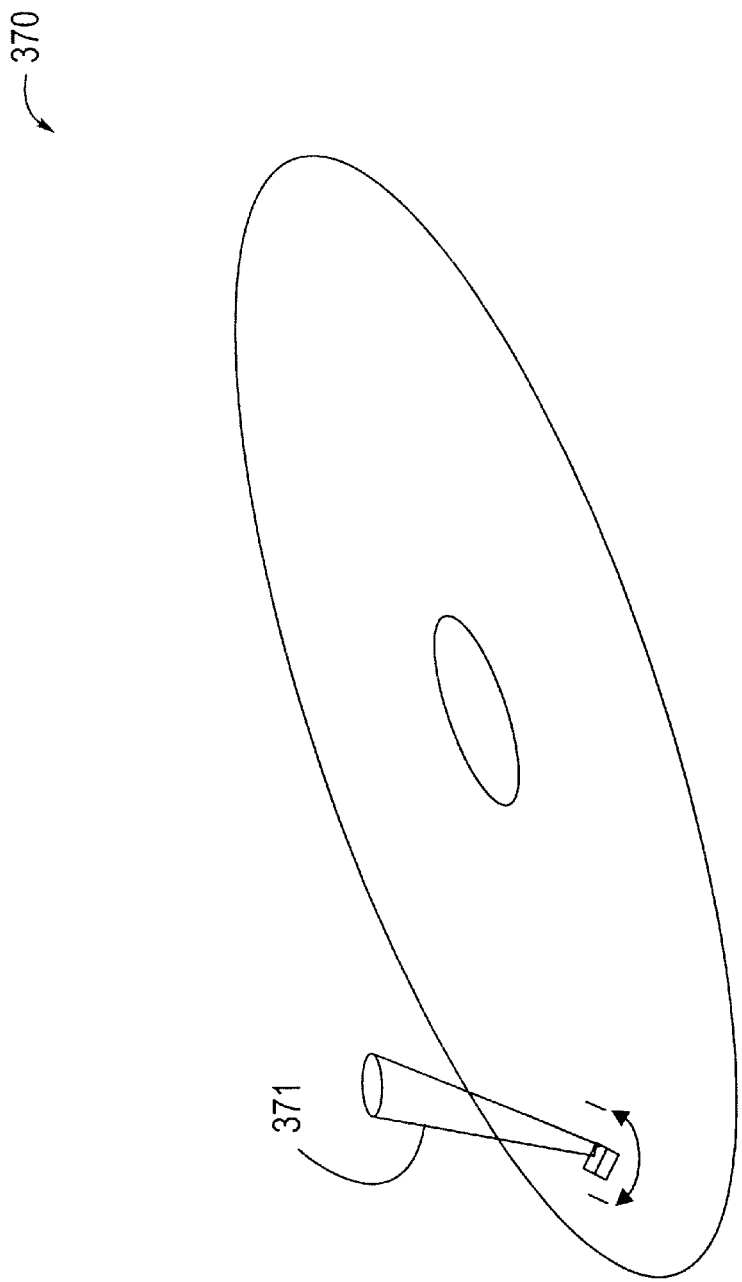
FIG. 3B illustrates one exemplary disk drive tracking control device according to one embodiment.

FIG. 3A illustrates an example of a design cycle flow chart of an operation 300 for designing a compensator for a disk drive tracking control system 370, shown in FIG. 3B, according to one embodiment. In this example, Operation 300 defines the structures of a disk drive tracking control model set and compensator set and chooses from several available criteria resulting in a high performance compensator design for the disk drive tracking control system.

At operation block 301, a model set S is defined. In this example, the model set S consists of linear dynamic models s that are identified by data from the real disk drive system. Each model in the model set describes the tracking operation of the disk drive 370 near a selected track and under a specific vibration conditions. Some examples of the vibration conditions are: none (i.e., no vibration), vibration along the X axis, vibration along the Y axis, and/or vibration along the Z axis. The tracks range from the inner most track of the disk drive 370 to the outermost track and are arranged according to their vibration conditions.

At operation block 303, a compensator set C is defined. In this example, one compensator c is designed for every model s in the model set S. Also for purposes of this example, the compensator set C, for the disk drive 370 consists of a smaller subset of all designed compensators from compensator set C.

In this example at operation block 305, the choice is made to constrain the size of the disk drive 370 model set S. thus, fixing the total number of models s in the model set S (size(S)$\leq n_s$). Constraining the size consists of selecting a fixed number of tracks that are uniformly spaced between the inner and outer disk 370 diameters.

Also in this example at operation block 307, the choice is made to constrain the size of compensator set C for the disk drive tracking control system 370. The compensator set C is constrained by fixing the total number of compensators c in the compensator set C (size(C)$\leq n_c$). In this example, the fixed number is chosen based upon the available embedded system resources of the disk drive 370.

Alternatively constraining the compensator set is performed such that there is one compensator for each of the models in the disk drive 370 model set. For example a vibration condition for a track in the middle location of the disk drive 370, in area 371 consists of 4 models to represent vibration conditions in all x, y, and z directions as well as the absence of a vibration condition for that area of the track.

Further in this example at operation block 309, the choice is made to optimize the performance of the compensator set C for the disk drive 370 (maximize(perf(C,S)). In this example, the compensators c are chosen to optimize the worst-case performance of the compensator set as applied to the models s in the model set S.

Figure 3C:
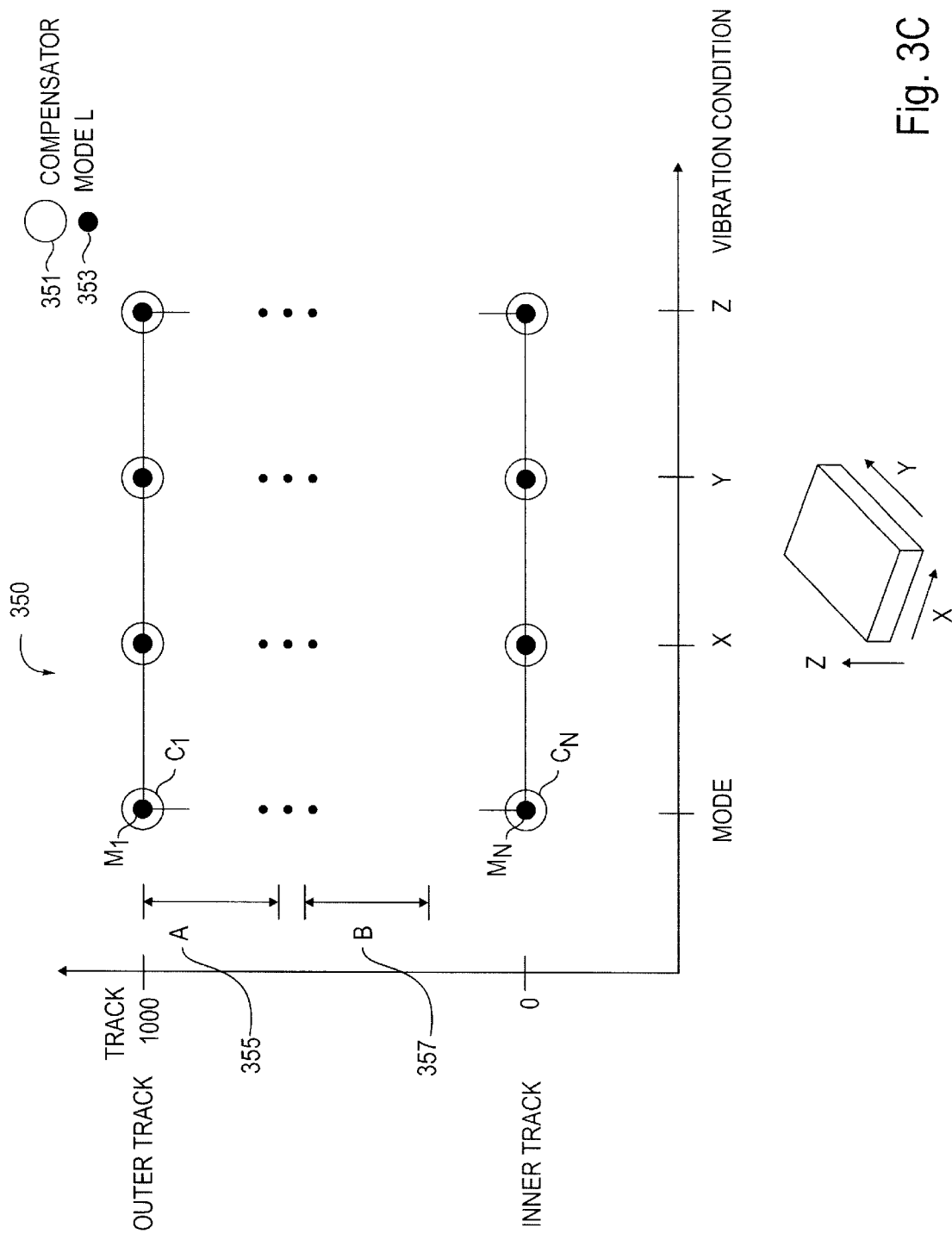
FIG. 3C illustrates one embodiment of a model set and compensator set for a disk drive tracking control system.

For example, FIG. 3C shows one embodiment of the model set and compensator set for the disk drive 370 tracking control system. The models 353 in the model set are arranged according to their vibration levels in all directions. A compensator 351, is assigned to each model 353 in the model set. Other criteria selected for generating the model set in FIG. 3C include decisions made earlier in preceding operation blocks, such as, constraining the size of a model set S, constraining the size of a compensator set C, optimizing the performance of compensators, and setting a worst-case performance value as the performance level.

Alternatively, other optimizing and constraining decisions could also be performed to generate the model set and compensator set for the disk drive 370 tracking control system.

At operation block 313, a set of compensator design parameters and the number of compensators in the compensator set are selected. The compensator design parameters are assigned based upon the outside influences that the user desires. For example, the user may be designing the compensator in order to produce a disk drive system that has a high level of tracking accuracy. Other such influences may be the available compute power or memory space available to the particular disk drive, etc. In this example, the number of compensators in the compensator set are selected to cause the models s in the model set S to perform as close the desired manner (performance optimized) as possible while constraining the number of models and compensators.

In this example, because of the previous design decisions made in receding operation blocks, at operation block 315 a compensator c is designed for every model s in the model set using the selected compensator design parameters set earlier in operation block 313. FIG. 3C is an example of an array showing all the models 353 of the model set and a compensator 351 designed for each model 353.

At operation block 317, the performance of every compensator c in compensator set C is tested against every model s in the model set S perf($c_1 \ldots c_{nc}, s_1 \ldots s_{ns}$). For example, as shown in FIG. 3B, there are a finite number of models $M_1$ though $M_n$, and a finite number of compensators $c_1$ through $c_n$. The performance of compensator $c_1$ is tested against all models $M_1$ through $M_n$ perf($c_1, M_1 \ldots M_n$). The performance of compensator $c_2$ is tested against all the models $M_1$ through $M_n$ perf($c_2, M_1 \ldots M_n$), and so on until the performance of all the compensators $c_1$ through $c_n$ are tested against each model $M_1$ through $M_n$. A table of all the testing results is constructed for all the models and compensators.

At operation block 319, a determination is made whether the entire model set can be stabilized (i.e., the performance level is met) with at least one subset of compensators $C_i$ from the compensator set C. The testing results obtained by testing each compensator against each model are used for stabilization. The highest performance attained by a single compensator c when tested against any model s in the model set S is used as the high performance value for that compensator set C. All the compensators in the set are assigned this performance value and re-tested to determine if they produce satisfactory results.

If all the compensators with same value assigned do not test satisfactorily in supporting all the models then the design process is repeated from operation block 313. During repetition of the design process, at operation block 313, the design parameters and number of compensators are changed for producing a satisfactory result. Alternatively, compensator design parameters and/or umber of compensators in the compensator set can be changed. Operation blocks 313, 315, 317, and 319 are repeated until the determination results in a satisfactory result.

If all the compensators with the same assigned value test satisfactorily in supporting all the models, then the compensator set can be stabilized using the highest performance value for all the compensators.

At operation block 321, a choice is made to select a compensator subset $C_i$ ($n_c$ compensators) for optimizing the worst-case performance of the compensator set C as applied to the model set S. At operation block 323, the compensator design for the disk drive tracking control system 370 is completed.

THERMAL REACTOR EXAMPLE

Figure 4A:
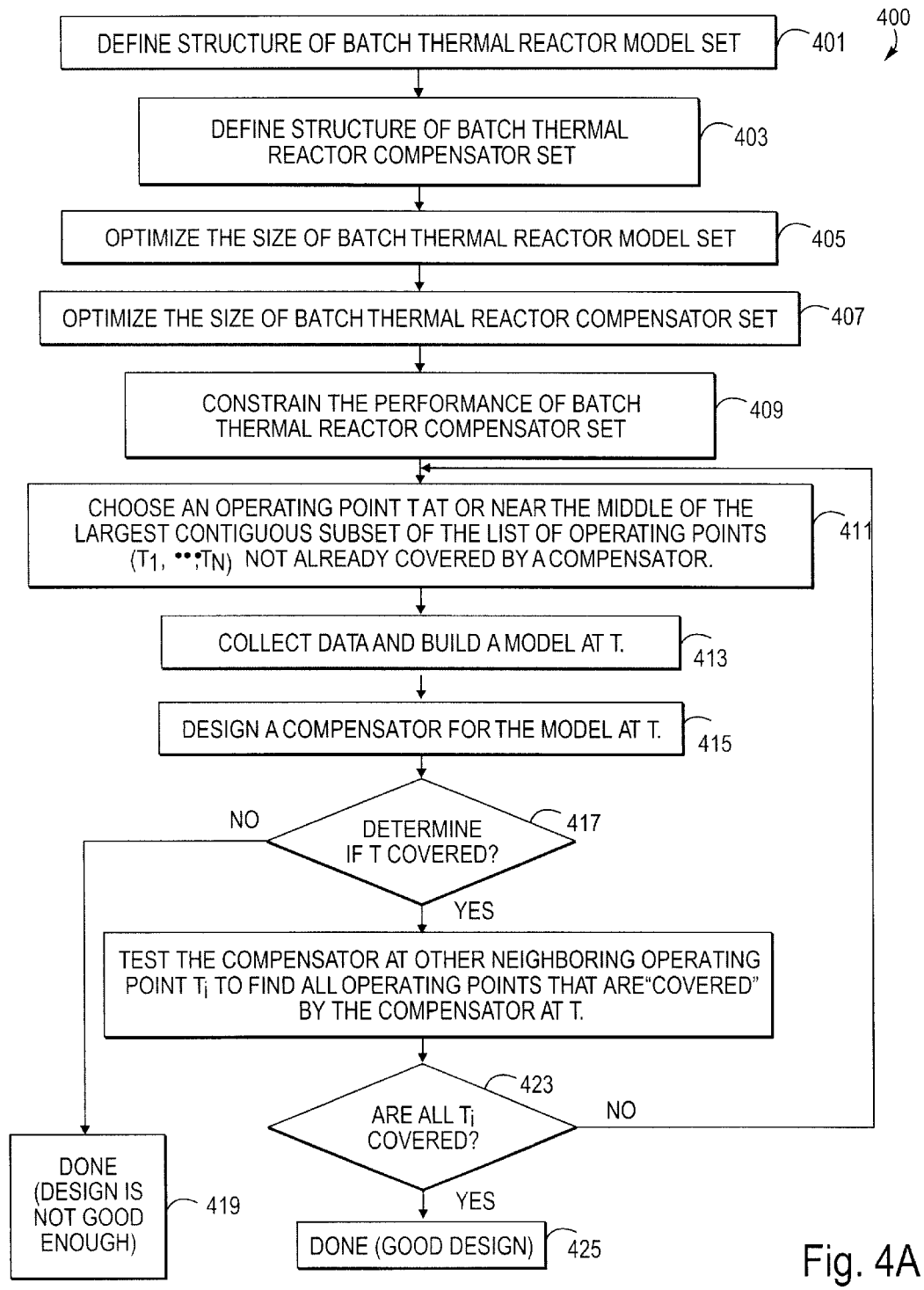
FIG. 4A illustrates a design cycle flow chart for designing a compensator for a batch thermal reactor system according to one embodiment.

FIG. 4A illustrates an example of a design cycle flow chart of an operation 400 for designing a compensator for a batch thermal reactor system according to one embodiment of the present invention. In this example, Operation 400 defines the structures of a batch thermal reactor model set and compensator set and chooses from several available criteria resulting in a high performance compensator design for the batch thermal reactor system.

At operation block 401, the structure of a model set for the batch thermal reactor is defined. In this example, the batch thermal reactor contains a furnace that is operated within a general operating temperature range between minimum temperature ($T_{min}$ 451), and maximum temperature ($T_{max}$) of the furnace. A finite set of operating points $\{T_1, \ldots, T_n\}$ are selected from within the temperature operating range. The model set for the batch thermal reactor consists of a plurality of models that describe the behavior of the batch thermal reactor at some or all of operating points $\{T_1, \ldots, T_n\}$.

At operation block 403, a compensator set C for the batch thermal reactor is defined. In this example, the compensator set C consists of a fixed-order of linear quadratic compensators. To start out one compensator is built for every model in the batch thermal reactor model set. Alternatively, more than one or less than one compensator c may be built to support models s in the batch thermal reactor model set S.

In this example at operation block 405, the choice is made to optimize the size of the batch thermal reactor model set (min(size(S))). In this example, because building models in a thermal reactor environment is very costly and time consuming, the choice to optimize the size of the model set and building a few models, aids in reducing operating costs and efficiency. However, the user should still bear in mind that the number of models built depends upon the complexity and need for accuracy in the system.

Also in this example at operation block 407, the choice is made to optimize the size of the batch thermal reactor compensator set C (min(size(C))). In this example, the motivation for optimizing the size of the compensator set C is that choosing fewer compensators improves the final multiple-compensator product by minimizing the number of transitions between compensators.

Further in this example at operation block 409, the choice is made to constrain the performance of the compensator set C in the batch thermal reactor (perf(C,S)$\geq$P). In this example, a set level of performance is predetermined and specified at the beginning of the design process. Thus, the compensator set C must meet or exceed this set performance level when tested at operating block 421.

At operation block 411, an operating point temperature is selected. The operating point is selected near the middle of the largest contiguous subset of the list of operating points $\{T_1, \ldots, T_n\}$ that are not already covered by a compensator. It should be noted that if this is the first pass of this portion of the design then none of the operating points have been determined to be covered by a compensator and thus the first operating point to be selected may be chosen at random.

At operation block 413, data is collected from the selected operating point temperature (T) and used to build a model s at that operating point temperature (T).

At operation block 415, a compensator is designed for the model s built at operating point temperature (T). The data collected at the operating point temperature (T) is used in building the compensator. FIG. 4B shows one example of a batch thermal reactor model and compensator set 450 with a model $M_1$ and a compensator $c_1$, generated at operating temperature (T) range 453.

At operation block 417, a determination is made whether the model and compensator built from data collected from the operating point temperature (T) actually covers the temperature that exists at operating point (T). The determination is made after standard measuring tests are performed by comparing the current existing temperature at operation point (T) in the real system to the temperature rating produced by the model and the compensator.

At operation block 421, the compensator is tested at other neighboring operating points. Other neighboring operating points are selected near the other large contiguous subset of operating points $\{T_1, \ldots, T_n\}$ that are in the neighborhood of T. If the determination in operation block 417 results in the model/compensator design covering the temperature at the operating point (T) for which they were designed, the compensator is tested at the other selected neighboring points.

At operation block 423, a determination is made whether the testing result show that the compensator designed for operating point (T) covers any of the neighboring operating points. If the testing indicates that the neighboring operation points are not covered by the compensator designed for operating point (T) then the process in operation blocks 411, 413, 415, 417, and 421 is repeated.

During repetition of the process (i.e., at each iteration of the process), at operation block 411 operating points different from the earlier selected operating point (T) are selected. In the example illustrated in FIG. 4B, the $2^{nd}$ iteration 461, data is collected from two operating points and a model /compensator $M_2C_2$ 459 and $M_3C_3$ 457 are designed from the collected data for both operating points.

A determination is made if both $M_2C_2$ and $M_3C_3$ cover the operating point for which they are designed. If they do then they are tested against all neighboring operating points to determine if they cover the neighboring points. If they do not, then a 3$^{rd}$ iteration 413 is performed. Alternatively, the process is repeated until a successful combination of models/compensators are found encompassing all neighboring operating points.

At operation block 425, a model/compensator combination that results in covering all the neighboring operation points is achieved. The design process is complete and a good design meeting all the constraints and optimization criteria have been met.

However, supposing that the iterative cycle has been performed a few times and a compensator can still not be designed to achieve the user's desired results then the user may desire to stop the design cycle. The user may determine that a good design cannot be built for this particular problem given the particular constraints and optimization decisions made earlier. Thus, at operation block 419, it may be determined that the model/compensator design does not cover the temperature at the operating point (T), the design process is terminated and the design is not used.

OPEN-LOOP EXAMPLE

Figure 5:
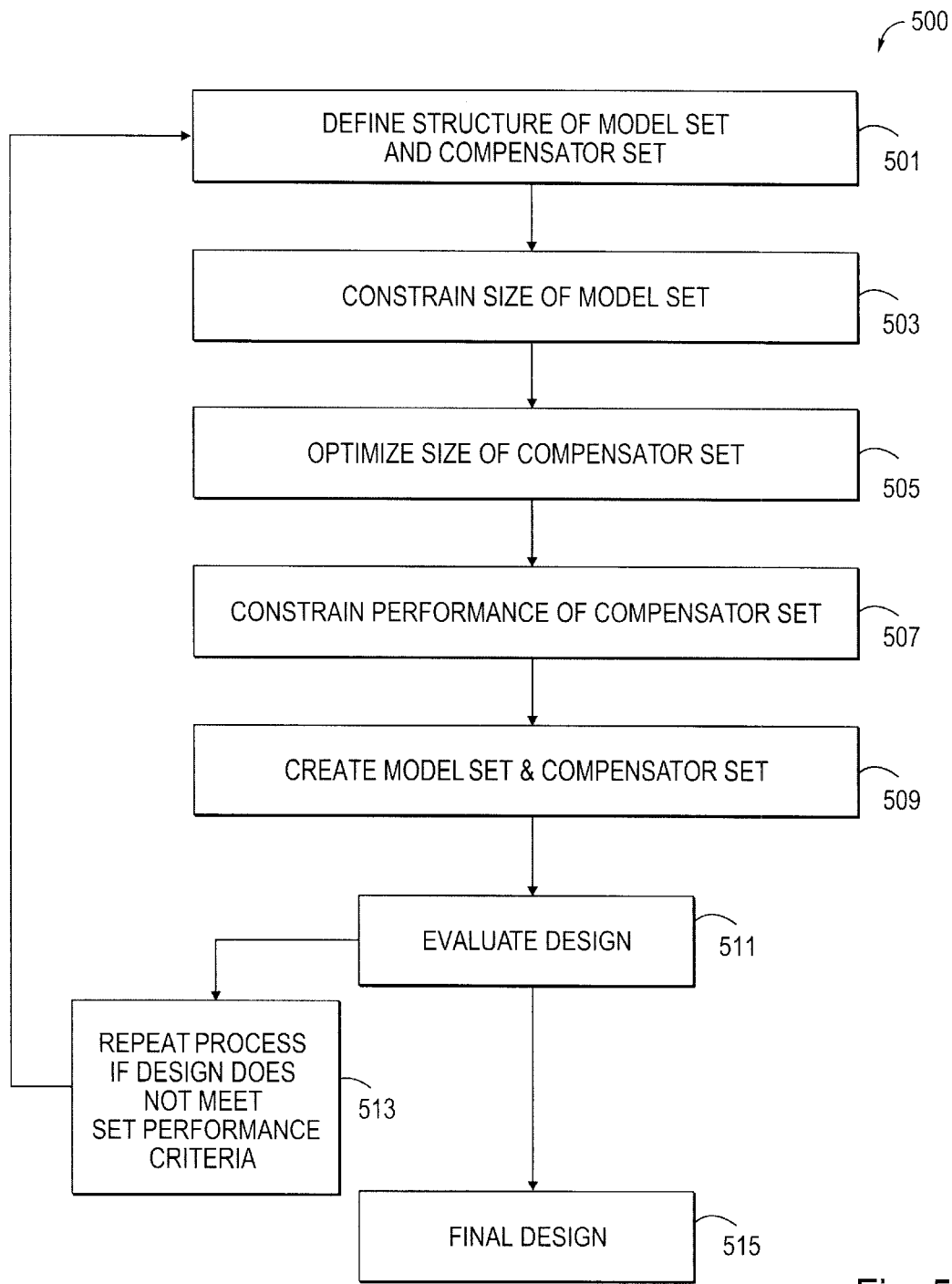
FIG. 5 illustrates a design cycle flow chart for designing a compensator for an open-loop pre-compensation system according to one embodiment.

FIG. 5 illustrates a design cycle flow chart of an operation 500 for designing a compensator for an open-loop compensation system according to one embodiment of the present invention. One example of an open-loop compensation system is a communications channel that transmits a signal. The signal is distorted within the communications channel thus it is desirous to put a compensator in the communications channel to compensate for the distortion of the signal. In this example Operation 500 defines the structure of the open-loop compensation model set S and compensator set C and chooses from several available criteria resulting in a high performance compensator design for the open-loop compensation.

At operation block 501, the structures of the model set and the compensator set for the open-loop compensation system are defined.

In this example at operation block 503, the choice is made to constrain the size of the open-loop compensation model set S (size(S)$\leq n_s$). A fixed number of plants are chosen to represent the entire family of plants. The fixed number of plants are chosen such that they are a representative sample of all behaviors in the family of plants. Alternatively, the fixed number of plants represent only those behaviors in the family of plants for which compensation is desired. The user predetermines the fixed number of models for the open-loop compensation system.

Also in this example at operation block 505, the choice is made to optimize the size of the compensator set (min(size (C))). As few number of compensators as possible are selected. The few number of compensators are determined by the number of compensators needed for matching the desired behavior of plants within a desired tolerance.

Further in this example at operation block 507, the choice is made to constrain the performance of the compensator set (perf(C,S)$\geq$P). In this example, the performance of the compensator set is constrained to a worst-case performance level.

At operation block 509, a model set and compensator set is created. The model set and compensator set is created based on the optimization and constraining decisions made in operation blocks 503, 505, and 507.

At operation block 511, the model set/compensator set combination is evaluated. The evaluation consists of comparing the performance values attained by the model/compensator combination to a desired behavior of the plant in the open-loop compensation system.

If the designed model/compensator combination does not match the desired behavior of the plant then the process in operation blocks 501, 503, 505, 507, 509, and 511 is repeated. During repetition only parameters that require a change to attain a match between the designed model/compensator combination and the desired behavior of the plant are changed. For example, if by adding one more compensator to the open-loop compensation system results in a match between designed model/compensator combination and the desired behavior of the plant then only one compensator is added and remaining parameters during the repetition (or iteration) are unchanged.

At operation block 515, the design process is completed. If the designed model/compensator combination matches the desired behavior of the plant then the design process is completed.

Thus, a method and system for compensator design optimization through efficient utilization of subcompensators have been described. Although specific embodiments, including specific equipment, parameters, methods, and algorithms have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for designing a compensator comprising:
    a) defining a structure of a model set including a size;
    b) defining a structure of a compensator set including a size;
    c) choosing to either optimize or constrain the size of the model set;
    d) choosing to either optimize or constrain the size of the compensator set;
    e) choosing to either optimize or constrain the performance of the compensator set with regard to the model set;
    f) creating the model set, the compensator set, and a model subset subject to the optimization and constraint decisions previously made to create a compensator design; and
    g) evaluate the compensator design,
        wherein if the compensator design meets a performance level set in step e) then the compensator design is completed, and
        wherein if the compensator design does not meet a performance level set in step e) then return to step a).

2. The method of claim 1 further comprising:
organizing the model set according to a desired criteria.

3. The method of claim 1 further comprising:
organizing the compensator set according to a desired criteria.

4. The method of claim 1 further comprising:
assigning at least one compensator of the compensator set to a model subset.

5. The method of claim 1 wherein the steps for choosing to either optimize or constrain the size of the model set, size of the compensator set, and performance of the compensator set with regard to the model set are performed in a matrix relationship.

6. A computer readable medium containing executable instructions which, when executed in a processing system, cause said system to perform a method comprising:

a) defining a structure of a model set including a size;

b) defining a structure of a compensator set including a size;

c) choosing to either optimize or constrain the size of the model set;

d) choosing to either optimize or constrain the size of the compensator set;

e) choosing to either optimize or constrain the performance of the compensator set with regard to the model set;

f) creating the model set, the compensator set, and a model subset subject to the optimization and constraint decisions previously made to create a compensator design; and g) evaluate the compensator design, wherein if the compensator design meets a performance level set in step e) then the compensator design is completed, and wherein if the compensator design does not meet a performance level set in step e) then return to step a).

7. The computer readable medium of claim 6 further comprising:

organizing the model set according to a desired criteria.

8. The computer readable medium of claim 6 further comprising:

organizing the compensator set according to a desired criteria.

9. The computer readable medium of claim 6 further comprising:

assigning at least one compensator of the compensator set to a model subset.

10. The computer readable medium of claim 6 wherein the steps for choosing to either optimize or constrain the size of the model set, size of the compensator set, and performance of the compensator set with regard to the model set are performed in a matrix relationship.

* * * * *

UNITED STATES PATENT AND TRADEMARK OFFICE
CERTIFICATE OF CORRECTION

PATENT NO. : 6,487,696 B1
DATED : November 26, 2002
INVENTOR(S) : Gudmundsson et al.

It is certified that error appears in the above-identified patent and that said Letters Patent is hereby corrected as shown below:

Column 6,
Line 14, delete " $\sum_{j=0}^{k}$ " and insert -- $\sum_{i=o}^{k}$ --.

Column 11,
Line 57, delete "C," and insert -- $C_i$ --.
Line 61, delete "S." and insert -- S, --.

Column 12,
Line 49, delete "receding" and insert -- preceding --.

Column 13,
Line 18, delete "umber" and insert -- number --.

Column 16,
Lines 34 and 35, delete first occurrence of "a" and insert -- the --.
Lines 34 and 35, delete "including a size".

Column 17,
Lines 4 and 5, delete first occurrence of "a" and insert -- the --.
Lines 4 and 5, delete "including a size".

Signed and Sealed this

Twenty-second Day of April, 2003

JAMES E. ROGAN
*Director of the United States Patent and Trademark Office*